(12) United States Patent
Hajimiri et al.

(10) Patent No.: US 11,342,886 B2
(45) Date of Patent: May 24, 2022

(54) IN-SITU LOW-COST SMALL SIZE SENSING AND MEASUREMENT FOR WIRELESS POWER TRANSFER SYSTEMS

(71) Applicant: GuRu Wireless, Inc., Pasadena, CA (US)

(72) Inventors: Seyed Ali Hajimiri, Pasadena, CA (US); Behrooz Abiri, Pasadena, CA (US); Florian Bohn, Pasadena, CA (US)

(73) Assignee: GuRu Wireless, Inc., Pasadena, CA (US)

( * ) Notice: Subject to any disclaimer, the term of this patent is extended or adjusted under 35 U.S.C. 154(b) by 31 days.

(21) Appl. No.: 16/198,547

(22) Filed: Nov. 21, 2018

(65) Prior Publication Data

US 2019/0214948 A1 Jul. 11, 2019

Related U.S. Application Data

(60) Provisional application No. 62/589,507, filed on Nov. 21, 2017.

(51) Int. Cl.
*H03F 3/21* (2006.01)
*H03F 1/02* (2006.01)
(Continued)

(52) U.S. Cl.
CPC ............ *H03F 1/0277* (2013.01); *H02M 7/04* (2013.01); *H03F 3/189* (2013.01); *H03F 3/21* (2013.01);
(Continued)

(58) Field of Classification Search
CPC .......... H03F 1/0277; H03F 3/189; H03F 3/21; H03F 2200/435; H02M 7/04; H03H 7/0161; H04B 1/0475
See application file for complete search history.

(56) References Cited

U.S. PATENT DOCUMENTS 4,187,506 A    2/1980   Dickinson
5,873,048 A * 2/1999   Yun ........................... G01S 5/04
                                                                                                 455/446

(Continued)

OTHER PUBLICATIONS

Wikipedia contributors, "Microwave," Wikipedia, The Free Encyclopedia, Web, Oct. 23, 2020.
(Continued)

*Primary Examiner* — Dinh T Le
(74) *Attorney, Agent, or Firm* — Weaver Austin Villeneuve & Sampson LLP

(57) ABSTRACT

An RF power detector adapted to detect an RF power of an RF signal, includes, in part, an antenna adapted to receive the RF signal, a narrow-band RF power converter adapted to convert the RF signal to a DC signal, an accelerometer, and a magnetometer. The accelerometer and magnetometer are adapted to determine the orientation and location of the power detector. The power detector optionally includes a gyroscope. The narrow-band RF power converter may be a rectifier tuned to the frequency of the RF signal. The power detector optionally includes an indicator adapted to provide information representative of the amount of the DC power of the DC signal, as well as position and orientation of the power detector. The power detector may be adapted to be inserted into a mobile device so as to provide the information about the amount of DC power, orientation and position to the mobile device.

45 Claims, 6 Drawing Sheets

(51) Int. Cl.
*H03F 3/189* (2006.01)
*H03H 7/01* (2006.01)
*H04B 1/04* (2006.01)
*H02M 7/04* (2006.01)

(52) U.S. Cl.
CPC ......... *H03H 7/0161* (2013.01); *H04B 1/0475* (2013.01); *H03F 2200/435* (2013.01)

(56) References Cited

U.S. PATENT DOCUMENTS

| | | | |
|---|---|---|---|
| 6,967,462 B1 | 11/2005 | Landis | |
| 7,362,795 B1 * | 4/2008 | Lennen | G01S 19/29 342/357.68 |
| 2016/0197522 A1 | 7/2016 | Zeine et al. | |
| 2020/0083752 A1 | 3/2020 | Bohn et al. | |

OTHER PUBLICATIONS

U.S. Appl. No. 16/513,622, Non-Final Office Action dated Nov. 4, 2020.
U.S. Office Action dated Jul. 23, 2021 in U.S. Appl. No. 16/513,622.
U.S. Notice of Allowance dated Dec. 17, 2021 in U.S. Appl. No. 16/513,622.

* cited by examiner

IN-SITU LOW-COST SMALL SIZE SENSING AND MEASUREMENT FOR WIRELESS POWER TRANSFER SYSTEMS

CROSS REFERENCE TO RELATED APPLICATIONS

The present application claims benefit under 35 USC 119(e) of Application Ser. No. 62/589,507, filed Nov. 21, 2017, the content of which is incorporated herein by reference in its entirety.

FIELD OF THE INVENTION

The present invention relates to measurement of wirelessly delivered power.

BACKGROUND OF THE INVENTION

Wireless power transfer systems use various technologies to transfer energy from one location to another without the aid of wires, cables, or other physical connections. Radio frequency (RF), microwave and mm wave signals have been used to form beams to transfer power to a desired location while minimizing power delivery to unwanted directions. This is important for several reasons, including but not limited to, optimizing the energy transfer efficiency, avoiding potential interference with other devices, and maintaining user or operator-definable levels of electromagnetic signal strength at various locations.

One central part of such techniques is the ability to positively and actively verify the power levels and beam profiles in various locations while the wireless power transmission is in effect. While this can generally be achieved with specialty precision RF and microwave measurement equipment (for example, a combination of a horn antenna, microwave cable, microwave spectrum analyzers, microwave and mm-wave power meters), such systems are generally bulky, expensive, and require very specialized expertise to operate.

BRIEF SUMMARY OF THE INVENTION

An RF power detector adapted to detect an RF power of an RF signal, in accordance with one embodiment of the present invention, includes, in part, an antenna, a narrow-band RF power converter, an accelerometer, and a magnetometer. The antenna is adapted to receive the RF signal and has dimensions defined by the wavelength of the RF signal. The narrow-band RF power converter is adapted to convert the RF signal to a DC signal. The accelerometer; and magnetometer operate to determine the orientation and location of the power detector.

In one embodiment, the RF power detector further includes, in part, a gyroscope. In one embodiment, the frequency of the RF signal is constant. In one embodiment, the narrow-band RF power converter is a rectifier adapted to convert the RF signal to the DC signal. In one embodiment, the rectifier is tuned to a frequency of the RF source generating the RF signal.

In one embodiment, the RF power detector further includes, in part, an indicator supplying information representative of the amount of the DC power of the DC signal. In one embodiment, the indicator further supplies information representative of the position of the RF power detector. In one embodiment, the indicator further supplies information representative of the orientation of the RF signal. In one embodiment, the indicator further supplies information representative of the frequency of the RF signal. In one embodiment, the indicator further supplies information representative of the polarization of the RF signal. In one embodiment, the indicator includes, in part, one or more light emitting diodes.

In one embodiment, the power detector is adapted to be inserted into a mobile communication/computation device so as to provide the information about the amount of DC power, the orientation and the position to the mobile communication/computation device for display by the mobile communication/computation device. In one embodiment, the power detector further includes, in part, a transmitter adapted to transmit information about the amount of DC power, the orientation and the position.

In one embodiment, the RF power detector further includes, in part, a bandpass filter adapted to filter out RF signals falling outside a predefined frequency band. In one embodiment, the RF power detector further includes, in part, an amplifier disposed between the antenna and the rectifier.

In one embodiment, the narrow-band RF power converter includes, in part, a mixer adapted to downconvert a frequency of the RF signal, and a low-pass filter coupled to an output of the mixer and adapted to supply a substantially DC signal. In one embodiment, the RF power detector further includes, in part, an amplifier disposed between the low-pass filter and the indicator. In one embodiment, the power detector further includes, in part, a low-noise amplifier disposed between the antenna and the mixer.

In one embodiment, the narrow-band power converter includes, in part, a first mixer adapted to downconvert a frequency of the RF signal to an intermediate frequency signal, a first amplifier adapted to amplify the intermediate frequency signal, and a second mixer adapted downconvert the intermediate frequency signal to a substantially DC signal. In one embodiment, the RF power detector of claim 19 further includes, in part, a low-noise amplifier disposed between the antenna and the first mixer. In one embodiment, the RF power detector of claim 19 further includes, in part, a second amplifier disposed between the second mixer and the indicator. In one embodiment, the RF power detector has an area that does not exceed 2 cm². The antenna may be a patch antenna, a dipole antenna, a slot antenna, and the like.

An RF power detector, in accordance with one embodiment of the present invention, includes, in part, an antenna adapted to receive an RF signal, a narrow-band RF power converter adapted to convert the RF signal to a DC signal, a circuit adapted to identify a location of the RF power detector in accordance with one or more of a polarization, time of flight or Doppler measurement of the RF signal received by the antenna, and an orientation sensor.

In one embodiment, the power detector further includes, in part, a gyroscope. In one embodiment, the power detector further includes, in part, an indicator supplying information representative of the amount of the DC power of the DC signal. In one embodiment, the indicator further supplies information representative of the position of the RF power detector. In one embodiment, the indicator further supplies information representative of the orientation of the RF signal. In one embodiment, the indicator further supplies information representative of the frequency of the RF signal. In one embodiment, the indicator further supplies information representative of the polarization of the RF signal. In one embodiment, the indicator includes, in part, one or more light emitting diodes.

In one embodiment, the power detector is adapted to be inserted into a mobile communication/computation device so as to provide the information about the amount of DC power, the orientation and the position to the mobile communication/computation device for display by the mobile communication/computation device. In one embodiment, the power detector further includes, in part, a transmitter adapted to transmit information about the amount of DC power, the orientation and the position.

In one embodiment, the narrow-band RF power converter includes, in part, a mixer adapted to downconvert a frequency of the RF signal, and a low-pass filter coupled to the output of the mixer and adapted to supply a substantially DC signal.

In one embodiment, the narrow-band RF power converter includes, in part, a first mixer adapted to downconvert the frequency of the RF signal to an intermediate frequency signal, a first amplifier adapted to amplify the intermediate frequency signal, and a second mixer adapted downconvert the intermediate frequency signal to a substantially DC signal. In one embodiment, the power detector has an area that does not exceed 2 $cm^2$.

An RF power detector, in accordance with one embodiment of the present invention, includes, in part, first and second antennas each adapted to receive an RF signal and each having a dimension defined by the wavelength of the RF signal, a narrow-band RF power converter adapted to convert the RF signal to a DC signal, and a circuit adapted to identify the position and the orientation of a source of the RF signal in accordance with the RF signal received by the first and second antennas.

In one embodiment, the RF power detector further includes, in part, a gyroscope. In one embodiment, the RF power detector further includes, in part, an indicator supplying information representative of the amount of the DC power of the DC signal. In one embodiment, the indicator further supplies information representative of the position. In one embodiment, the indicator further supplies information representative of the orientation. In one embodiment, the indicator further supplies information representative of the frequency of the RF signal. In one embodiment, the indicator further supplies information representative of the polarization of the RF signal.

The RF power detector of claim 39 wherein said indicator comprises one or more light emitting diodes. In one embodiment, the power detector is adapted to be inserted into a mobile communication/computation device so as to provide the information about the amount of DC power, the orientation and the position to the mobile communication/computation device for display by the mobile communication/computation device. In one embodiment, the power detector further includes, in part, a transmitter adapted to transmit information about the amount of DC power, the orientation and the position.

In one embodiment, the narrow-band RF power converter includes, in part, a mixer adapted to downconvert the frequency of the RF signal, and a low-pass filter coupled to an output of the mixer to supply a substantially DC signal.

In one embodiment, the narrow-band RF power converter includes, in part, a first mixer adapted to downconvert the frequency of the RF signal to an intermediate frequency signal, a first amplifier adapted to amplify the intermediate frequency signal, and a second mixer adapted downconvert the intermediate frequency signal to a substantially DC signal. In one embodiment, the RF power detector has an area not exceeding 2 $cm^2$.

DETAILED DESCRIPTION OF THE INVENTION

Figure 1:
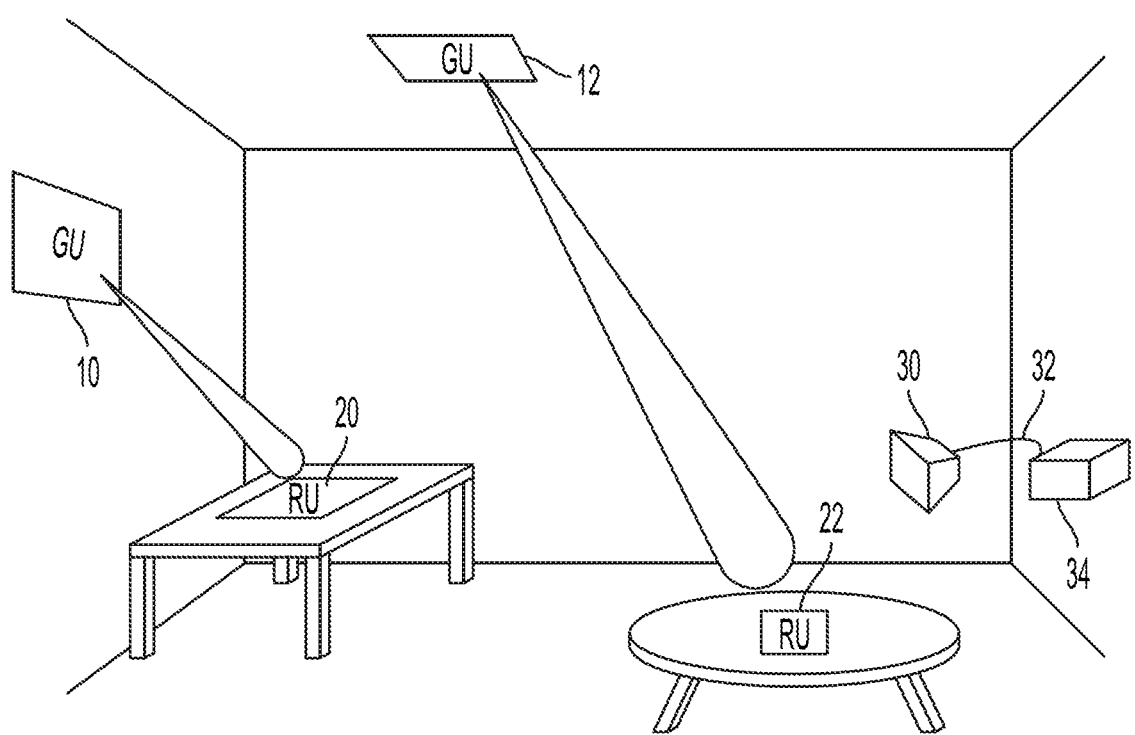
FIG. 1 shows a pair of wireless power transfer generation units transmitting RF power to a pair of devices.

FIG. 1 shows an example in which two wireless power transfer generation units (GUs) 10 and 12 transmit power and form energy beams to power devices 20 and 22 each containing a power recovery unit (RU). Each RU converts the received radio frequency signal to a usable DC power to charge the device in which it is disposed. Conventional systems require, among other elements, a microwave horn antenna (or other calibrated antennas) 30 together with RF cable 32 and spectrum analyzer 34 or an external dedicated RF and microwave power meter system to measure the amount of power delivered at each location where the RU may be placed. The horn antenna, RF cable and spectrum analyzers are generally bulky, expensive, and require very specialized expertise to operate.

In accordance with embodiments of the present invention, users and operators are enabled to relatively quickly and effortlessly verify the amount of power delivered wirelessly including, but not limited to, measuring the power received wirelessly (such as RF, mm-wave, or optical such as Infrared) at various locations while the systems remains active to view. Such measurement and verification may be used to determine, among other things, the effectiveness of the beam-forming and focusing nature of long range wireless power transfer, and its ability to limit exposure at other areas. Embodiments of the present invention may also be used to demonstrate regulatory compliance and proper operation of the unit(s), without the need for expensive RF measurement equipment that cannot be readily found and/or afforded by the end user and/or operator.

A wireless power detection and monitoring system, in accordance with embodiments of the present invention, may be used to map the availability of RF power in different locations of, for example, a room. The mapped power can be used to provide information to the user of wireless power system. Such information includes, but not limited, to an optimum charging location for the device to be wirelessly charged, and an optimum placement location for the transmitters supplying the wireless power. To achieve such mapping capability, in one embodiment, the power detection and monitoring device, in accordance with one embodiment of the present invention, uses orientation/location detection sensors, such as magnetometers, accelerometers, gyros, time of flight sensors, GPS, and the like.

Figure 2:
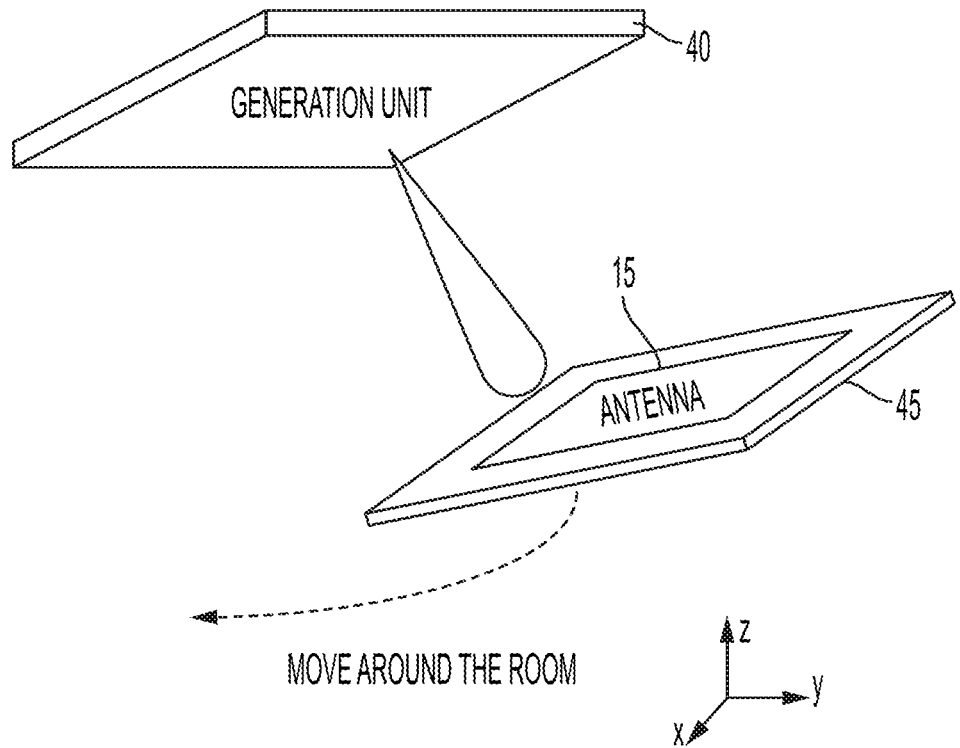
FIG. 2 shows an RF power detector detecting power from an RF power generation circuit, in accordance with one embodiment of the present invention.

FIG. 2 shows a wireless power generation unit 40 adapted to transmit a radio frequency (RF) signal for wireless charging. Power detection device 45 (alternatively referred to herein as power detector) which includes an antenna 15 (such as a patch antenna) receives the RF power, in accordance with one embodiment of the present invention, and maps the RF power in the room. To achieve this, a user moves device 45 around the room while trying to find the orientation that maximizes the detected power. Power detection device 45 monitors the orientation at which maximum power is received for each location and stores this information in order to generate a map of the availability of RF power in different locations in the room.

Figure 3:
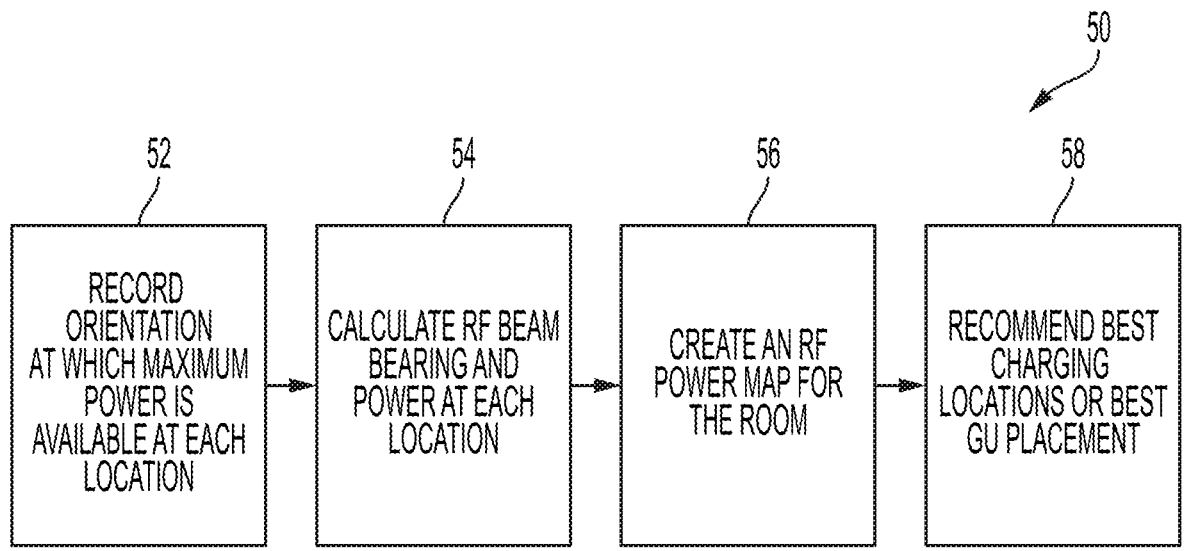
FIG. 3 is a flowchart for mapping the RF power at various locations of a room via an RF power detector, in accordance with one embodiment of the present invention.

FIG. 3 is a flowchart 50 of steps for mapping the received RF power at various locations of a room, in accordance with one embodiment of the present invention. At 52 for each location the orientation at which maximum power is available is detected and recorded. At 54, the RF beam bearing and the available power at each such location is calculated. At 56 an RF power map is created for the room. At 58 the best RF charging location for a device to be charged and/or the best position for the placement for wireless power generation unit 40 is provided.

Figure 4:
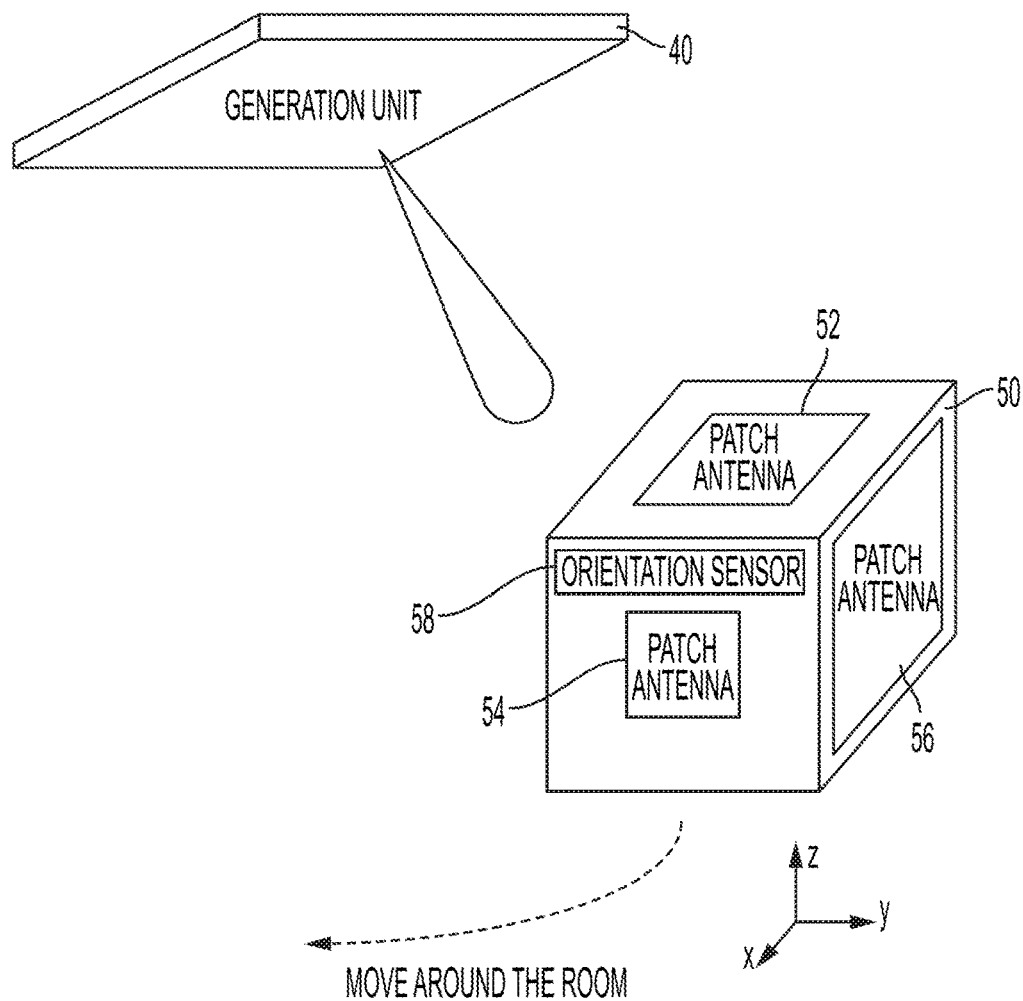
FIG. 4 shows an RF power detector detecting power from an RF power generation circuit, in accordance with one embodiment of the present invention.

FIG. 4 shows a wireless power generation unit 40 adapted to transmit an RF signal for wireless charging. Power detector 50, which includes multiple antennas 52, 54 and 56 (such as a patch antenna), receives the RF signal, in accordance with one embodiment of the present invention, and maps the available RF power at each location in the room. In the exemplary embodiment of FIG. 4, power detector 50 is shown as including three antennas 52, 54, and 56, however, it is understood that power detector 50 may include any number of antennas. The multiple antennas of power detector 50 are used to detect the bearing of the RF beam with respect to power detector 50. Orientation sensor 58 disposed in power detector 50 is used to map the relative bearing of the beam at the device to a relative bearing of the beam with respect to the room. Accordingly, the user does not need to reorient the device to receive the maximum power as he/she moves the object around the room.

Figure 5:
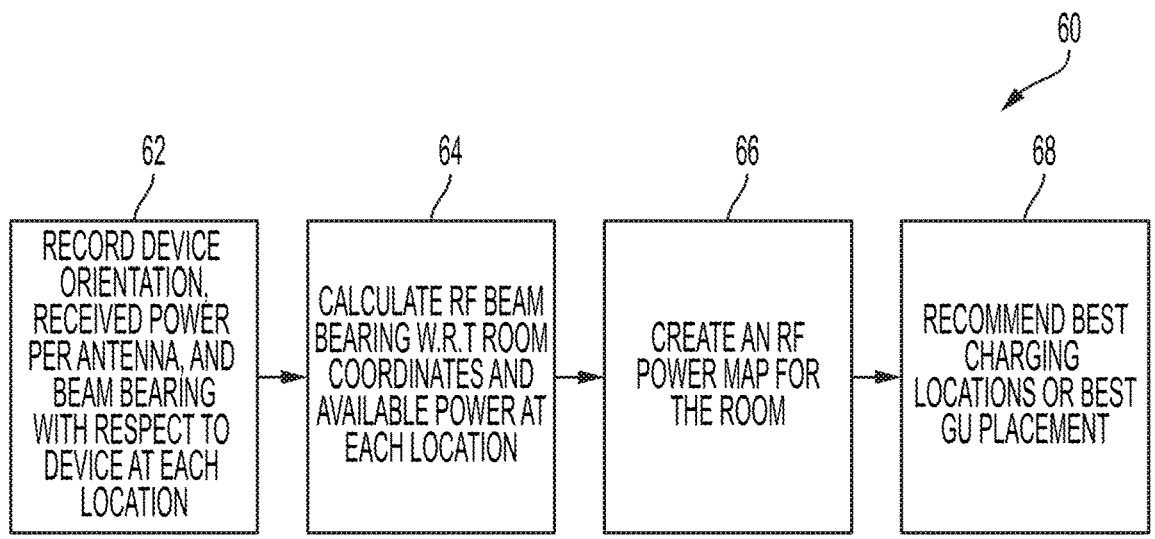
FIG. 5 is a flowchart for mapping the RF power at various locations of a room via an RF power detector, in accordance with one embodiment of the present invention.

FIG. 5 is a flowchart 60 of steps for mapping the received RF power at various locations of a room, in accordance with one embodiment of the present invention. At 62 for each location, the device orientation, received power per antenna, and the RF beam bearing with respect to the device is detected and recorded. At 64, the RF beam bearing with respect to the room coordinates and the available RF power at each location is calculated. At 66 an RF power map is created for the room. At 68, the best RF charging location for a device to be charged and/or the best position for the placement for wireless power generation unit 40 is provided.

Figure 6:
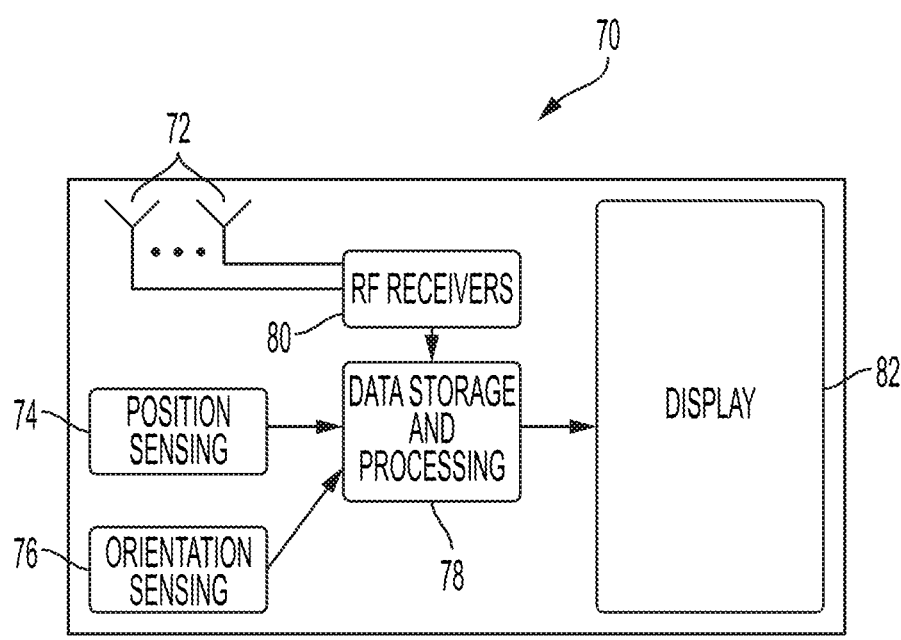
FIG. 6 is a simplified high-level block diagram of a wireless power detector, in accordance with one embodiment of the present invention.

FIG. 6 is a block diagram of a wireless power detector 70, in accordance with one embodiment of the present invention. Power detector 70 is shown as including one or more antenna 72, an RF receiver 80, data storage and processing block 78, a position sensor 74, an orientation sensor 76, and a display 82.

The RF is received by RF receiver 80 via antenna(s) 72. Data storage and processing block 78 receives position information supplied by position sensor 74, orientation position supplied by orientation sensor 76 and the power received by RF receiver 80 to store a map of the power for each position and orientation, as described above. Display 82 is used to display the amount of power for each device position and orientation. In some embodiments, power detector 70 also includes an RF transmitter for transmitting information about the amount of power present at each position and orientation to another device, such as a mobile device or to the GU. The multiple antennas of power detector 70 enable the RF receivers 80 to obtain both the phase and amplitude information received from each antenna. The phase information is used to find direction of arrival of the RF signal (i.e., the bearing of the RF beam with respect to power detector 70), and the amplitude together with the direction of arrival of the RF beam is used to find the RF beam power.

Figure 7:
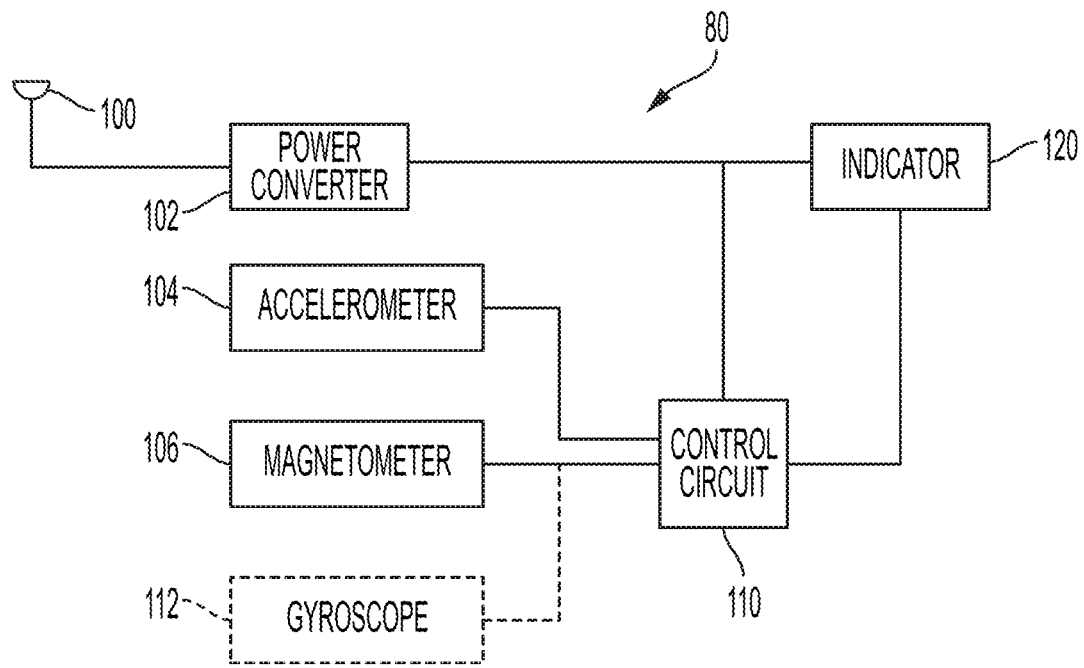
FIG. 7 is a simplified high-level block diagram of a wireless power detector, in accordance with one embodiment of the present invention.

FIG. 7 is a high-level block diagram of a wireless power detector 80, in accordance with one embodiment of the present invention. Power detector 80 is shown as including in part, an antenna 100, a power converter 102, an accelerometer 104, a magnetometer 106, a control circuit 110 and an indicator 120. Antenna 102 receives and delivers the radiated RF signal to power converter 102 which converts the received RF signal to a DC power. Control circuit 110 receives the readouts from accelerometer 104 and magnetometer 106 to determine the orientation and location of power detector 80. Indicator 120 indicates, among other things, the amount of DC power received by power detector 80. Power detector 80 is advantageously small, light-weight, and low cost and may be placed at any location by the end user to measure the amount of wireless power being delivered to any location. Some embodiments of a power detector, in accordance with any of the embodiments of the present invention, have areas that do not exceed 2 cm$^2$.

Some embodiments of power detector 80 may not include an indicator. Such embodiments may be adapted to be inserted into another device (e.g., a mobile phone) that includes a display. In such embodiments, the information about the amount of DC power at each location, as well as any other information (such as the orientation), is transferred from power detector 80 to the mobile phone for display by the mobile phone. Other embodiments of power detector 80 that do not include an indicator may include a wireless transmitter adapted to transmit information about the amount of RF power at each location, as well as any other information such as the orientation, to a mobile phone. The information so transmitted wirelessly is displayed by the mobile phone.

In one embodiment, antenna 100 is a relatively small low-profile low-cost antenna such as a patch, dipole, or slot antenna. In other embodiment, a standalone low profile antenna may be attached to power converter 102 to receive the RF signal and enable power converter 102 to convert the RF, mm-wave signal to a DC signal.

Antenna 100 may be a narrowband antenna adapted to achieve the desired selectivity to reject the signal received from other sources of RF signal generation, such as cellular phones, WiFi and Bluetooth transmitters. Although not shown, some embodiments of power detector 80 include an optional amplifier adapted to amplify the signal receive by antenna 100. In other embodiments, power detector 80 includes a bandpass filter adapted to remove frequency components of the RF signal received by antenna 100. In yet other embodiments, power detector 80 optionally includes both an amplifier and a bandpass filter, as described above.

In some embodiments, power detector 80 includes a gyroscope. In some embodiments, the frequency of the RF signal received by antenna 100 is constant. In some embodiments, power converter 102 is a rectifier that may be tuned to the frequency of the radiated RF signal. In some embodiments, in addition to the amount of power, indicator 120 indicates information representative of the position and/or orientation of power detector 80 and/or the orientation of the received RF signal. In yet other embodiments, indicator 120 indicates information representative of the frequency and/or polarization of the received RF signal.

In one embodiment, indicator 102 includes, in part, one or more low-power light emitting diodes (LED) or ultra-low-power miniaturized incandescent light bulb(s) to indicate the amount of RF signal received at the band of interest. The LED (or the bulb) will turn on when the received RF signal reaches a predefined level, which will correspond to the threshold voltages of the LED. A group of LEDs with different threshold voltages (either established by using different color LEDs or created by additional voltage drop circuity, such as series resistors) may be used to indicate various signal power levels which are then indicated by indicator 120. Therefore, for example, the higher the amount of received power is, the higher will be the number of LEDs that turn on. In yet other embodiments, the color of the LEDs will be indicative of the amount of RF power being received. The power level can be indicated in many ways including an LED bar, 7 segment display, or fully programmable digital displays. In yet another embodiment, a tuned front-end displays the power and the band of interest, as well as the power at several radio frequency bands using a tuned or synthesized local oscillator frequency.

Figure 8:
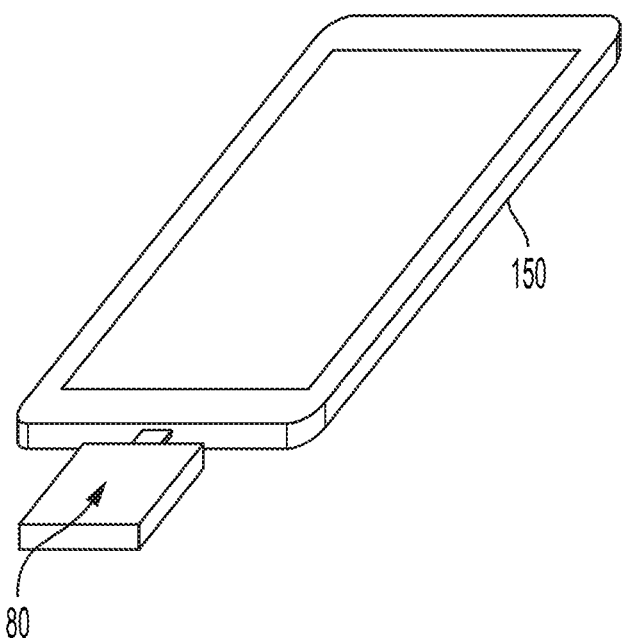
FIG. 8 shows a wireless power detector inserted in a mobile communication/computation device, in accordance with one embodiment of the present invention.

In one embodiment, power detector 80 is adapted to be inserted into a mobile communication/computation device, such as mobile phone 150 shown in FIG. 8. In some embodiments, power detector 80 is adapted to transfer the information such as the amount of received power, the location and orientation to mobile device 150. Mobile device 150 then displays the information supplied by power detector 80. In one embodiment, power detector 80 includes a transmitter controlled by control circuit 110. Such a transmitter is adapted to transfer the information such as the amount of received power, the location and orientation of power detector 80, wirelessly via antenna 110 or another antenna disposed in power detector 80.

Figure 9:
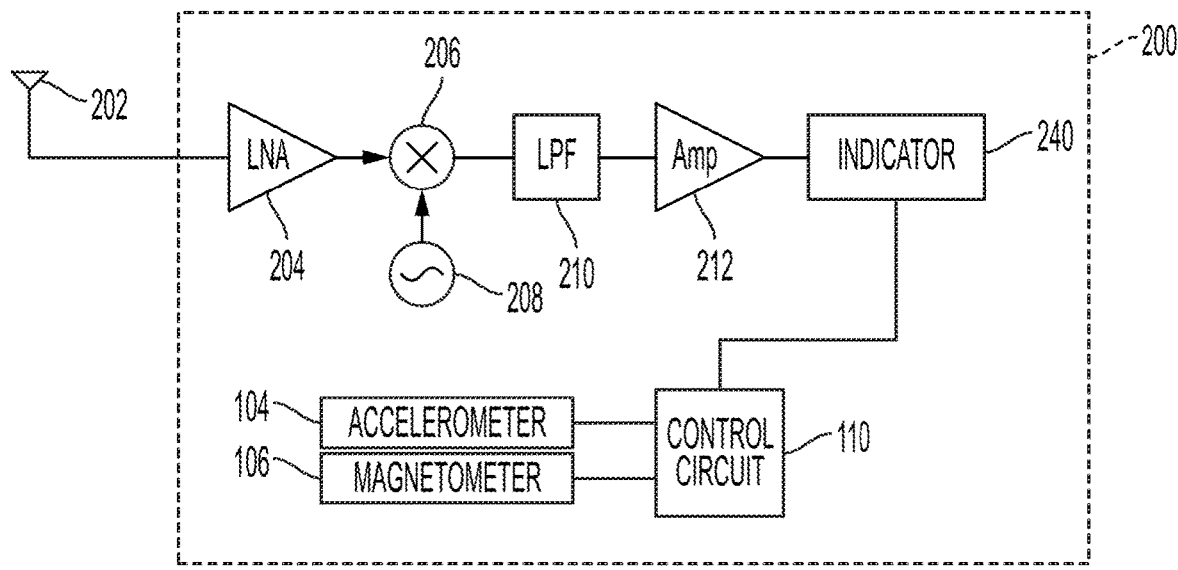
FIG. 9 is a simplified high-level block diagram of a wireless power detector, in accordance with one embodiment of the present invention.

FIG. 9 is a high-level block diagram of a wireless power detector 200, in accordance with another embodiment of the present invention. Power detector 200 is shown as including in part, an antenna 202, a mixer 206, a low-pass filter 210, an accelerometer 104, a magnetometer 106, a control circuit 110, and an indicator 240. Power detector 200 is also shown as including, in part, an optional low-noise amplifier 204 disposed between mixer 206 and antenna 202, as well as amplifier 212 disposed between low-pass filter 210 and indicator 240.

Antenna 202 receives and delivers the radiated RF signal to mixer 206. Mixer 206 is adapted to downconvert the frequency of the received RF signal to a substantially baseband signal in response to the oscillating signal mixer 206 receives from oscillator 208. Lowpass filter 210 is adapted to remove from the output of mixer 206 the frequency components of the signal that exceed a predefined value and supply a substantially DC signal to indicator 240. Amplifiers 204 and 212 are adapted to amplify the signals they receive.

Control circuit 110 receives the readouts from accelerometer 104 and magnetometer 106 to determine the orientation and location of power detector 200. Indicator 240 indicates the amount of DC power received by power detector 200. In one embodiment, antenna 202 is a relatively small low-profile low-cost antenna such as a patch, dipole, or slot antenna. In some embodiments, power detector 200 includes a gyroscope. In some embodiments, in addition to the amount of power, indicator 240 indicates information representative of the orientation of power detector 200 and/or the position and/or orientation of the received RF signal. In yet other embodiments, indicator 240 indicates information representative of the frequency and/or polarization of the received RF signal. In one embodiment, power detector 200 is adapted to be inserted into a mobile communication/computation device, such as mobile phone 150 shown in FIG. 8.

In some embodiments, power detector 200 is adapted to transfer the information such as the amount of received power, the location and orientation to mobile device 150. Mobile device 150 displays the information supplied by power detector 200. In one embodiment, power detector 200 includes a transmitter controlled by control circuit 110. Such a transmitter is adapted to transfer the information such as the amount of received power, the location and orientation of power detector 200, wirelessly via antenna 202 or another antenna disposed in power detector 200.

Figure 10:
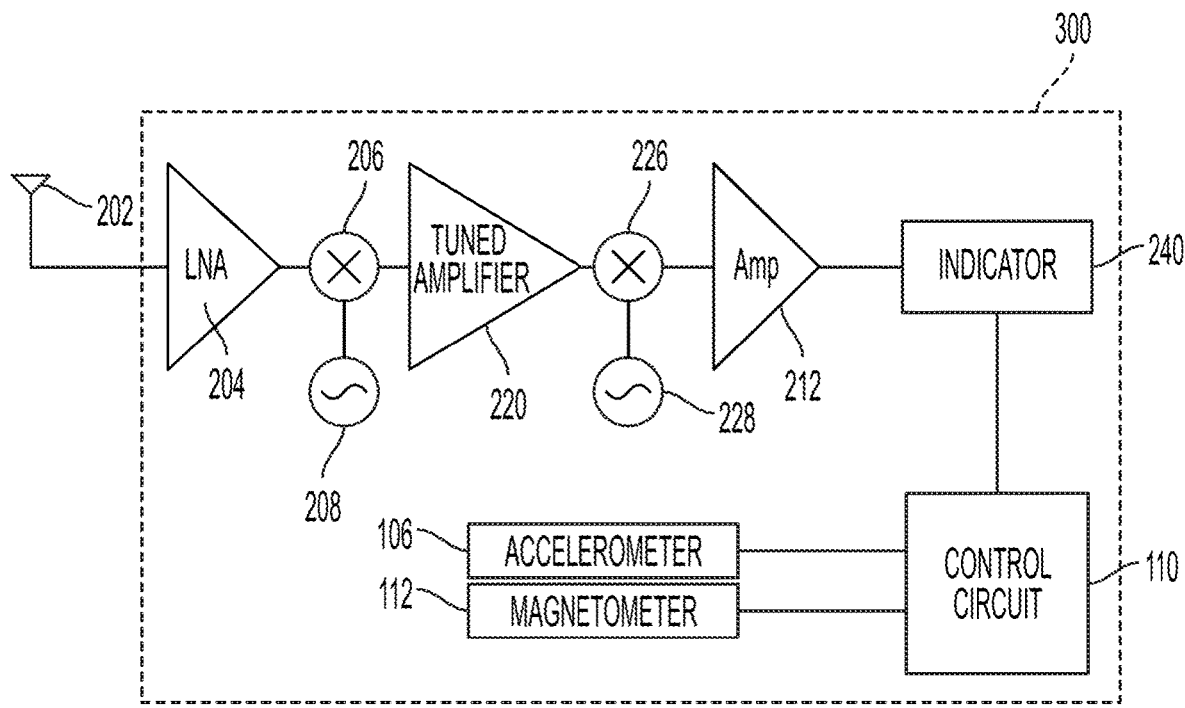
FIG. 10 is a simplified high-level block diagram of a wireless power detector, in accordance with one embodiment of the present invention.

FIG. 10 is a high-level block diagram of a wireless power detector 300, in accordance with another embodiment of the present invention. Power detector 300 is shown as including in part, an antenna 202, first and second mixers 206, 226, tuned amplifier 220, an accelerometer 104, a magnetometer 106, a control circuit 110, and an indicator 240. Power detector 300 is also shown as including, in part, an optional low-noise amplifier 204 disposed between mixer 206 and antenna 202, as well as amplifier 212 disposed between tuned amplifier 220 and indicator 240.

Antenna 202 receives and delivers the radiated RF signal to mixer 206. Mixer 206 is adapted to downconvert the frequency of the received RF signal to an intermediate frequency in response to the oscillating signal that mixer 206 receives from oscillator 208. Tuned amplifier 220 is tuned to a predefined band and is adapted to amplify the output of mixer 206. The frequency of the output of amplifier 220 is downconverted from the intermediate frequency to a substantially DC signal and supplied to indicator 240. Optional amplifier 212 is adapted to amplify the output of mixer 226.

Control circuit 110 receives the readouts from accelerometer 104 and magnetometer 106 to determine the orientation and location of power detector 300. Indicator 240 indicates the amount of DC power received by power detector 300. In one embodiment, antenna 202 is a relatively small low-profile low-cost antenna such as a patch, dipole, or slot antenna. In some embodiments, power detector 300 includes a gyroscope. In some embodiments, in addition to the amount of power, indicator 240 indicates information representative of the position and/or orientation of power detector 300 and/or the orientation of the received RF signal. In yet other embodiments, indicator 240 indicates information representative of the frequency and/or polarization of the received RF signal. In one embodiment, power detector 300 is adapted to be inserted into a mobile communication/computation device, such as mobile phone 150 shown in FIG. 8.

In some embodiments, power detector 300 is adapted to transfer the information such as the amount of received power, the location and orientation to mobile device 150. Mobile device 150 displays the information supplied by power detector 300. In one embodiment, power detector 300 includes a transmitter controlled by control circuit 110. Such a transmitter is adapted to transfer information such as the amount of received power, the location and/or orientation of power detector 300, wirelessly via antenna 202 or another antenna disposed in power detector 300.

The above embodiments of the present invention may be equally applied to transferring power using optical beams. This may be achieved using infrared band. Power detection in such systems may be achieved using, for example, a low-cost IR filter at the band of interest followed by a photodiode which converts the received IR signal into a DC signal. As described above, power detection may done in a passive manner, such as that shown in FIG. 7, or in an active manner, such as those shown in FIGS. 9 and 10.

The above embodiments of the present invention are illustrative and not limitative. Embodiments of the present invention are not limited by the type of device that may be wirelessly charged. Other additions, subtractions or modifications are obvious in view of the present disclosure and are intended to fall within the scope of the appended claims.

What is claimed is:

1. An RF power detector adapted to detect an RF power of an RF signal, the RF power detector comprising:
    an antenna adapted to receive the RF signal and having dimensions defined by a wavelength of the RF signal;
    a narrow-band RF power converter adapted to convert the RF signal to a DC signal;
    an accelerometer; and
    a magnetometer, said accelerometer and magnetometer operating to sense an orientation and location of the power detector so as to provide a mapping between the DC signal and the sensed orientation and location of the power detector.

2. The RF power detector of claim 1 further comprising a gyroscope to sense the orientation of the power detector so as to further provide the mapping between the DC signal and the sensed orientation and location of the power detector.

3. The RF power detector of claim 1 wherein the frequency of the RF signal is constant.

4. The RF power detector of claim 1 wherein said narrow-band RF power converter is a rectifier adapted to convert the RF signal to the DC signal.

5. The RF power detector of claim 4 wherein said rectifier is tuned to a frequency of an RF source generating the RF signal.

6. The RF power detector of claim 1 further comprising an indicator supplying information representative of an amount of the DC power of the DC signal.

7. The RF power detector of claim 6 wherein said indicator further supplies information representative of the position of the RF power detector.

8. The RF power detector of claim 7 wherein said indicator further supplies information representative of an orientation of the RF signal.

9. The RF power detector of claim 8 wherein said indicator further supplies information representative of a frequency of the RF signal.

10. The RF power detector of claim 9 wherein said indicator further supplies information representative of a polarization of the RF signal.

11. The RF power detector of claim 6 wherein said indicator comprises one or more light emitting diodes.

12. The RF power detector of claim 1 wherein said power detector is adapted to be inserted into a mobile communication/computation device so as to provide the information about the amount of DC power, the orientation and the position to the mobile communication/computation device for display by the mobile communication/computation device.

13. The RF power detector of claim 1 wherein said power detector further comprises a transmitter adapted to transmit information about the amount of DC power, the orientation and the position.

14. The RF power detector of claim 1 further comprising a bandpass filter adapted to filter out RF signals falling outside a predefined frequency band.

15. The RF power detector of claim 4 wherein said RF power detector further comprises an amplifier disposed between the antenna and the rectifier.

16. The RF power detector of claim 1 wherein said narrow-band RF power converter comprises:
    a mixer adapted to downconvert a frequency of the RF signal; and
    a low-pass filter coupled to an output of the mixer and adapted to supply a substantially DC signal.

17. The RF power detector of claim 16 further comprising an amplifier disposed between the low-pass filter and the indicator.

18. The RF power detector of claim 17 further comprising: a low-noise amplifier disposed between the antenna and the mixer.

19. The RF power detector of claim 1 wherein said narrow-band RF power converter comprises:
    a first mixer adapted to downconvert a frequency of the RF signal to an intermediate frequency signal;
    a first amplifier adapted to amplify the intermediate frequency signal;
    a second mixer adapted downconvert the intermediate frequency signal to a substantially DC signal.

20. The RF power detector of claim 19 further comprising:
    a low-noise amplifier disposed between the antenna and the first mixer.

21. The RF power detector of claim 20 further comprising a second amplifier disposed between the second mixer and the indicator.

22. The RF power detector of claim 4 wherein said RF power detector has an area not exceeding 2 $cm^2$.

23. The RF power detector of claim 16 wherein said RF power detector has an area not exceeding 2 $cm^2$.

24. The RF power detector of claim 19 wherein said RF power detector has an area not exceeding 2 $cm^2$.

25. The RF power detector of claim 1 wherein said antenna is selected from a group consisting of patch, dipole and slot antenna.

26. An RF power detector comprising:
    an antenna adapted to receive an RF signal and having a dimension defined by a wavelength of the RF signal;
    a narrow-band RF power converter adapted to convert the RF signal to a DC signal;
    circuitry adapted to identify a location of the RF power detector in accordance with one or more of a polarization, time of flight or Doppler measurement of the RF signal received by the antenna; and
    an orientation sensor operating to sense an orientation of the power detector thereby to enable a mapping between the DC signal and the sensed orientation and location of the power detector.

27. The RF power detector of claim 26 further comprising a gyroscope adapted to sense the orientation of the power detector so as to further enable the mapping between the DC signal and the sensed orientation and location of the power detector.

28. The RF power detector of claim 26 further comprising an indicator supplying information representative of an amount of the DC power of the DC signal.

29. The RF power detector of claim 28 wherein said indicator further supplies information representative of the position of the RF power detector.

30. The RF power detector of claim 29 wherein said indicator further supplies information representative of an orientation of the RF signal.

31. The RF power detector of claim 30 wherein said indicator further supplies information representative of a frequency of the RF signal.

32. The RF power detector of claim 31 wherein said indicator further supplies information representative of a polarization of the RF signal.

33. The RF power detector of claim 28 wherein said indicator comprises one or more light emitting diodes.

34. The RF power detector of claim 26 wherein said power detector is adapted to be inserted into a mobile communication/computation device so as to provide the information about the amount of DC power, the orientation and the position to the mobile communication/computation device for display by the mobile communication/computation device.

35. The RF power detector of claim 26 wherein said power detector further comprises a transmitter adapted to transmit information about the amount of DC power, the orientation and the position.

36. The RF power detector of claim 26 wherein said narrow-band RF power converter comprises:
a mixer adapted to downconvert a frequency of the RF signal; and
a low-pass filter coupled to an output of the mixer and adapted to supply a substantially DC signal.

37. The RF power detector of claim 26 wherein said narrow-band RF power converter comprises:
a first mixer adapted to downconvert a frequency of the RF signal to an intermediate frequency signal;
a first amplifier adapted to amplify the intermediate frequency signal;
a second mixer adapted downconvert the intermediate frequency signal to a substantially DC signal.

38. The RF power detector of claim 26 wherein said RF power monitoring device has an area not exceeding 2 cm2.

39. A method of mapping an RF power to each of a plurality of locations, the method comprising:
converting, at each of the plurality of locations in which a power detector is placed at a plurality of different times, the RF power to a DC power using a narrow-band converter disposed in the power detector;
sensing a position and orientation of the power detector at each of the plurality of locations using an accelerometer and a magnetometer disposed in the power detector; and
generating the mapping by indicating the DC power at each of the sensed plurality of positions and orientations.

40. The method of claim 39 wherein said power detector further comprising a gyroscope.

41. The method of claim 39 wherein said power detector is adapted to be inserted into a mobile communication/computation device so as to provide the information about the amount of DC power, the orientation and the position to the mobile communication/computation device for display by the mobile communication/computation device.

42. The method of claim 39 wherein said power detector further comprises a transmitter adapted to transmit information about the amount of DC power, the orientation and the position.

43. The method of claim 39 wherein said narrow-band RF power converter comprises:
a first mixer adapted to downconvert a frequency of the RF signal to an intermediate frequency signal;
a first amplifier adapted to amplify the intermediate frequency signal;
a second mixer adapted downconvert the intermediate frequency signal to a substantially DC signal.

44. A method of determining a position of an array of RF signal transmitters adapted to wirelessly transfer power, the method comprising:
converting, at each of a plurality of locations in which a power detector is placed at a plurality of different times, the RF signal to a DC power using a narrow-band converter disposed in the power detector;
sensing a position and an orientation of each of the plurality of locations using a position and orientation sensor disposed in the power detector; and
determining the position of the array of RF signal transmitters in accordance with the DC powers determined at the plurality of sensed positions and orientations.

45. The method of claim 39 wherein said narrow-band RF power converter comprises:
a mixer adapted to downconvert a frequency of the RF signal; and
a low-pass filter coupled to an output of the mixer and adapted to supply a substantially DC signal.

* * * * *